United States Patent
Asano

(10) Patent No.: US 7,294,900 B2
(45) Date of Patent: Nov. 13, 2007

(54) COMPOUND SEMICONDUCTOR DEVICE AND MANUFACTURING METHOD THEREOF

(75) Inventor: Tetsuro Asano, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/150,472

(22) Filed: Jun. 13, 2005

(65) Prior Publication Data

US 2005/0274979 A1    Dec. 15, 2005

(30) Foreign Application Priority Data

Jun. 14, 2004    (JP) .................... 2004-175701

(51) Int. Cl.
  *H01L 23/48*    (2006.01)
  *H01L 27/095*   (2006.01)
(52) U.S. Cl. .................. 257/472; 257/280; 257/784; 257/E23.02
(58) Field of Classification Search ............. 257/225, 257/501, 503, 504, 506, E23.039, E23.02, 257/E27.012, 192, 280, 472, 784
See application file for complete search history.

(56) References Cited

U.S. PATENT DOCUMENTS 5,504,353 A    4/1996    Kuzuhara
5,610,410 A    3/1997    Imanishi
6,072,203 A    6/2000    Nozaki et al.
6,281,528 B1   8/2001    Wada
6,534,790 B2   3/2003    Kato et al.

FOREIGN PATENT DOCUMENTS

JP    09-181642      7/1997
JP    2003-007724    1/2003

*Primary Examiner*—Matthew C. Landau
(74) *Attorney, Agent, or Firm*—Morrison & Foerster LLP

(57) ABSTRACT

A pad electrode of a field effect transistor is formed solely of a pad metal layer without providing a gate metal layer. A high concentration impurity region is provided below the pad electrode, and the pad electrode is directly contacted to a substrate. Predetermined isolation is ensured by the high concentration impurity region. Accordingly, in a structure not requiring a nitride film as similar to the related art, it is possible to avoid defects upon wire boding attributing to hardening of the gate metal layer. Therefore, in the case of a buried gate electrode structure for enhancing characteristics of the field effect transistor, it is possible to enhance reliability and yields.

9 Claims, 14 Drawing Sheets

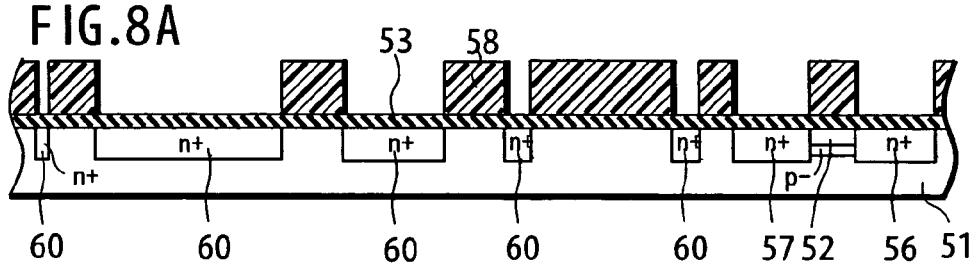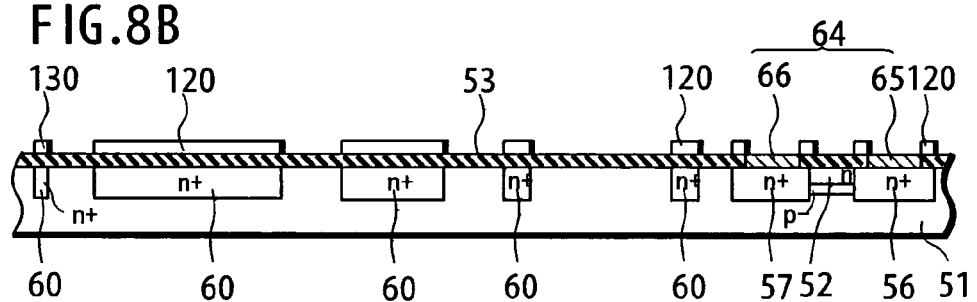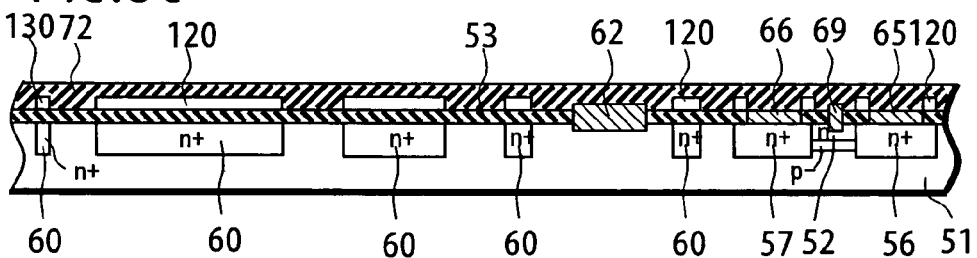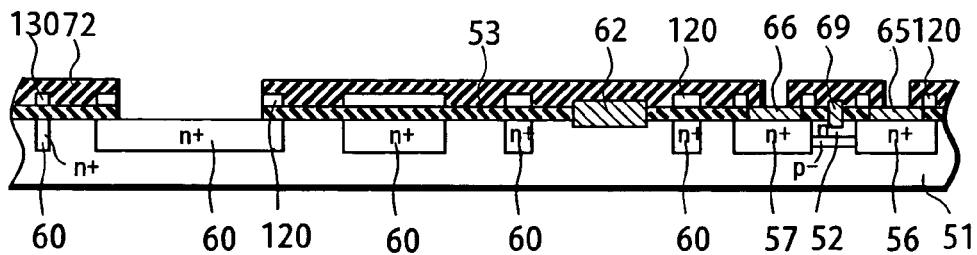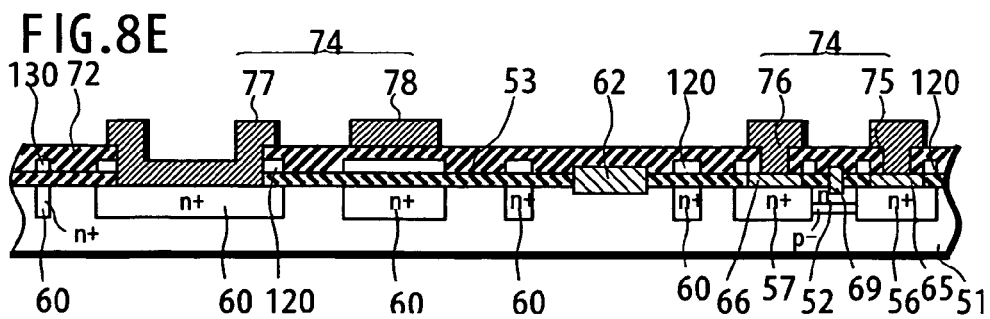

Prior Art

Prior Art

Prior Art

COMPOUND SEMICONDUCTOR DEVICE AND MANUFACTURING METHOD THEREOF

BACKGROUND OF THE INVENTION

1. Field of the Invention

The present invention relates to a compound semiconductor device and a manufacturing method of the same, particularly, to a compound semiconductor device and a manufacturing method of the same which are capable of enhancing characteristics of field effect transistors and reducing defects in wire bonding.

2. Background Art

Mobile communication devices such as mobile telephones often use microwaves in a gigahertz range and frequently use switching devices to switch antennas or transmitting/receiving for switching those high frequency signals (see Japanese Patent Application Publication No. Hei 9-181642, for example). Such devices often use field effect transistors (hereinafter referred to as FETs) using gallium arsenide (GaAs) to deal with microwave signals. In this concern, development of monolithic microwave integrated circuits (MMICs) configured to integrate the above-mentioned switching circuits are now in progress.

FIG. 17 is a schematic circuit diagram showing a principle of a compound semiconductor switching circuit called SPDT (single pole double throw) which uses FETs.

Here, sources (or drains) of first and second field effect transistors FET1 and FET2 are connected to common input terminal IN, and gates of the field effect transistors FET1 and FET2 are connected to first and second control terminals Ctl-1 and Ctl-2 through resistors R1 and R2, respectively. Moreover, drains (or sources) of the FETs are connected to first and second output terminals OUT1 and OUT2, respectively. Signals applied to the first and second control terminals Ctl-1 and Ctl-2 are complementary signals, and the FET to which a H-level signal is applied is turned ON to transmit a high frequency signal entered to the input terminal IN to one of the output terminals. The resistors R1 and R2 are disposed in order to prevent leakage of high frequency signals through the gate electrodes with respect to direct current potential at the control terminals Ctl-1 and Ctl-2, which is a AC ground potential.

A GaAs substrate is semi-insulating. However, in the case of integrating a switching circuit on the GaAs substrate, if a pad electrode layer for wire bonding is provided directly on the substrate, an electric interaction will remain between adjacent electrodes. Such an aspect may cause a lot of problems such as occurrence of damages by electrostatic discharge due to low insulation strength or deterioration in isolation due to leakage of a high frequency signal. Accordingly, a nitride film has been provided below a wiring layer or below pad electrodes in a conventional manufacturing method.

However, the nitride film is hard and therefore causes cracks on pad portions by pressure at the time of bonding. To suppress such cracks, gold plating has been applied to bonding electrodes on the nitride film. However, a gold plating process causes increases in the number of processes and in costs. Therefore, a technique for avoiding provision of the nitride film below the pad electrodes has been developed.

An example of a method of manufacturing FETs, pads, and wirings collectively constituting the conventional compound semiconductor switching circuit shown in FIG. 17 will be described with reference to FIG. 18A to FIG. 19B.

Firstly, as shown in FIG. 18A, an entire surface of compound semiconductor substrate 51 made of GaAs or the like is covered with silicon nitride film 53 for through-ion implantation in a thickness from about 100 Å to 200 Å. Next, a photolithography process for selectively forming an opening on a resist layer (not shown) above a channel layer formation region is performed. Thereafter, ions of a p$^-$-type impurity ($^{24}$Mg$^+$) are implanted and ions of an n-type impurity ($^{29}$Si$^+$) are implanted.

As a result, p$^-$-type region 55 is formed on the undoped substrate 51 and n-type channel layer 52 is formed thereon.

Next, the resist layer used in the precedent step is removed and the entire surface of the resultant structure is covered with silicon nitride film 53 for cap annealing. New resist layer 58 is provided and a photolithography process is performed to selectively form openings in the resist layer 58 above respective formation regions for source region 56, drain region 57, gate wiring 62, and first pad electrode 91. Subsequently, ions i of an n-type impurity ($^{29}$Si$^+$) are implanted on the surface of the substrate in the respective formation regions for the source region 56, the drain region 57, the gate wiring 62, and the first pad electrode 91 while using this resist 58 as a mask. In this way, the n$^+$-type source region 56 and drain region 57 are formed, and high concentration impurity region 60 for enhancing isolation is simultaneously formed on the surface of the substrate below the formation regions for the pad electrode 91 and the gate wiring 62. After removing the resist, activation annealing is performed to activate the n-type channel layer 52, the n$^+$-type source region 56 and drain region 57, and the high concentration impurity region 60.

As shown in FIG. 18B, resist layer 63 is provided again and a photolithography process is performed to selectively form openings for formation regions for first source electrode 65 and first drain electrode 66. The silicon nitride film 53 above the formation regions for the first source electrode 65 and the first drain electrode 66 is removed by CF$_4$ plasma, and subsequently, three layers of AuGe/Ni/Au collectively constituting ohmic metal layer 64 are sequentially evaporated by vacuum evaporation. Thereafter, the resist layer 63 is removed and the first source electrode 65 and the first drain electrode 66 are left on the source region 56 and the drain region 57 in contact by a lift-off method. Subsequently, ohmic junctions between the first source electrode 65 and the source region 56 and between the first drain electrode 66 and the drain region 57 are formed by an alloying heat treatment.

Next, as shown in FIG. 18C, a new resist layer (not shown) is provided and a photolithography process is performed to selectively form openings for respective formation regions for gate electrode 69, the first pad electrode 91, and the gate wiring 62. The silicon nitride film 53 exposed from the formation regions for the gate electrode 69, the first pad electrode 91, and the gate wiring 62 is subjected to dry etching, thereby exposing the channel layer 52 in the formation region for the gate electrode 69 and exposing the substrate 51 in the formation regions for the gate wiring 62 and the first pad electrode 91.

Thereafter, four layers of Pt/Ti/Pt/Au collectively constituting a gate metal layer as electrodes of a second metal layer are sequentially evaporated on the substrate 51 by vacuum evaporation. Then, the gate electrode 69, the first pad electrode 91, and the gate wiring 62 are formed by the lift-off method. Thereafter, a heat treatment for burying Pt is performed.

In this way, part of the gate electrode 69 is buried in the channel layer 52 while maintaining a Schottky junction with the substrate. By burying part of the gate electrode 69 in the channel layer 52, current density, channel resistance, and a high frequency distortion characteristic of a FET are substantially improved.

Then, as shown in FIG. 19A, passivation film 72 made of a silicon nitride film is formed on the surface of the substrate 51, and then a photolithography process and nitride film etching are performed. Accordingly, contact holes for the first source electrode 65, the first drain electrode 66, the gate electrode 69, and the first pad electrode 91 are formed on the passivation film 72.

After removing the resist, a new resist layer (not shown) is coated and a photolithography process is performed to selectively form openings in the resist above formation regions for second source electrode 75, second drain electrode 76, and second pad electrode 92. Subsequently, three layers of Ti/Pt/Au collectively constituting pad metal layer 74 as electrodes of a third metal layer are sequentially evaporated by vacuum evaporation and the lift-off method is performed thereon, thereby forming the second source electrode 75, the second drain electrode 76, and the second pad electrode 92 contacting the first source electrode 65, the first drain electrode 66, and the first pad electrode 91, respectively. Here, part of wiring portions are made by use of this pad metal layer 74, so that the pad metal layer 74 corresponding to the wiring portions are naturally left over.

Then, as shown in FIG. 19B, bonding wire 80 is bonded onto the second pad electrode 92. This technology is described for instance in Japanese Patent Application Publication No. 2003-007724.

As described above, the high concentration impurity regions 60 are provided below the pad electrode 91 and 92 and below the gate wiring 62 so as to protrude out of these regions. In this way, it is possible to suppress depletion layers extending from the pad electrodes 91 and 92 and the gate wiring 62 toward the substrate. Therefore, sufficient isolation can be ensured even when the pad electrodes 91 and 92 and the gate wiring 62 are provided directly on the GaAs substrate. Accordingly, it is possible to remove the nitride film which has been conventionally provided for the purpose of insulation.

When the nitride film is not required, it is not necessary to consider cracks of the nitride film under the pad electrodes 91 and 92 at the time of bonding of the bonding wire. Therefore, it is possible to omit the gold plating process which has been conventionally required. The gold plating process causes increases in the number of processes and in costs. That is, if it is possible to omit this process, such a technique can contribute largely to simplification of the manufacturing process and to cost reduction.

However, it is made clear that many problems occur at the time of bonding of the bonding wire when part of the gate electrode 69 was buried in the channel layer 52 to enhance characteristics of the FET as shown in FIG. 18C.

Part of the first pad electrode 91 made of gate metal layer 68 is also buried in the surface of the substrate in the step of the process to bury the gate electrode 69. That is, the problem is considered due to formation of a hard alloy layer as a result of a reaction of Pt of the lowermost layer of the first pad electrode 91 to Ga or As contained in the material for the substrate.

For this reason, problems such as degradation in bonding adhesion or gouges on the substrate occur and lead to reduction in yields or deterioration

SUMMARY OF THE INVENTION

The present invention provides a compound semiconductor device that includes a compound semiconductor substrate, a channel layer formed in the substrate, a source region and a drain region that are formed in the substrate and adjacent the channel layer, a gate electrode made of a gate metal layer and in contact with the channel layer, a source electrode comprising a first source electrode made of an ohmic metal layer and in contact with the source region and a second source electrode made of a pad metal layer and disposed on the first source electrode, a drain electrode comprising a first drain electrode made of the ohmic metal layer and in contact with the drain region and a second drain electrode made of the pad metal layer and disposed on the first drain electrode, a pad electrode made of the pad metal layer and in contact with the substrate, and a high concentration impurity region formed in the substrate and adjacent the pad electrode.

The present invention also provides a method of manufacturing a compound semiconductor device. The method includes providing a compound semiconductor substrate, forming a high concentration impurity region and an channel layer in the substrate, forming a gate electrode made of a first metal on the channel layer, forming a pad electrode made of a second metal so that the second metal is in contact with the substrate, the pad electrode being adjacent the high concentration impurity region, and bonding a bonding wire to the pad electrode.

The present invention further provides a method of manufacturing a compound semiconductor device. The method includes providing a compound semiconductor substrate, forming in the substrate a channel layer, a source region and a drain region that are adjacent the channel layer, and a high concentration impurity region, depositing a first metal layer on the substrate so as to form a first source electrode on the source region and a first drain electrode on the drain region, depositing a second metal layer on the substrate so as to from a gate electrode on the channel layer; depositing a third metal layer on the substrate so as to form a second source electrode on the first source electrode, a second drain electrode on the first drain electrode and a pad electrode that is in contact with the substrate and adjacent the high concentration impurity region, and bonding a bonding wire to the pad electrode.

BRIEF DESCRIPTION OF THE DRAWINGS

FIGS. 8A to 8E are cross-sectional views for describing a second embodiment of the present invention.

DESCRIPTION OF THE PREFERRED EMBODIMENTS

Now, embodiments of the present invention will be described with reference to FIG. 1A to FIG. 16 concerning a FET, an electrode pad, and a wiring portion collectively constituting a switching circuit device (a SPDT) and the like shown in FIG. 17 as an example.

Figure 1A:
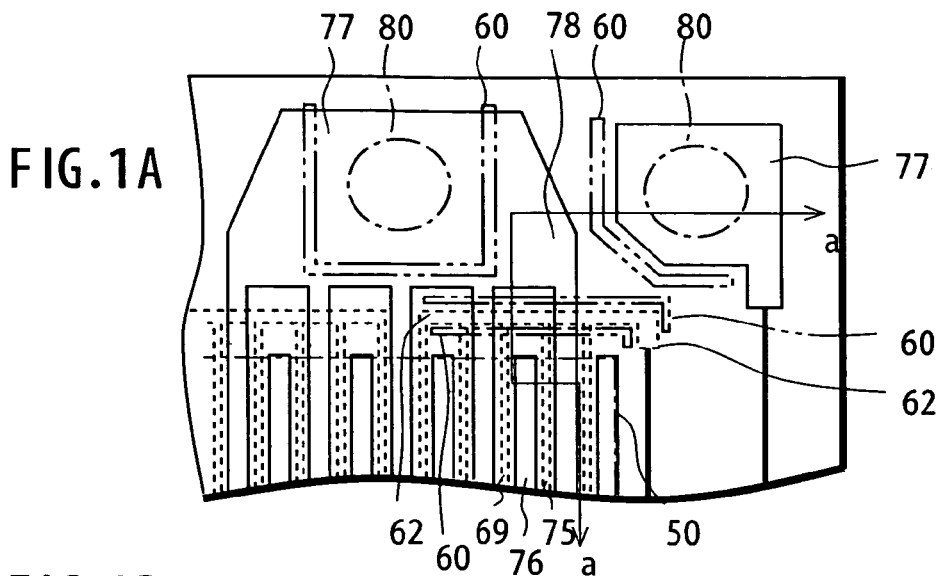
FIG. 1A is a plan view and FIGS. 1B to 1D are cross-sectional view for describing embodiments of the present invention.
Figure 1B:
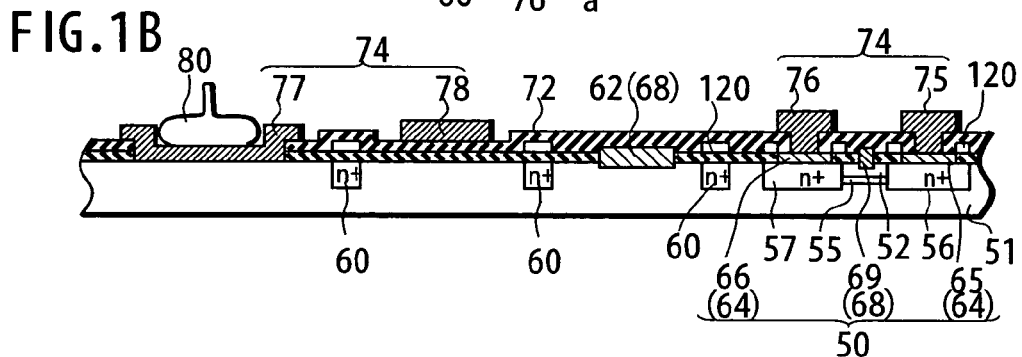

FIGS. 1A to 1D are views showing an example of a compound semiconductor device of embodiments of the present invention, in which FIG. 1A is a plan view and FIG. 1B is a cross-sectional view taken along the a-a line. Here, the same formation elements as those in the related art are designated by the same reference numerals.

As shown in FIGS. 1A and 1B, in a compound semiconductor device, compound semiconductor substrate 51 is provided with a p$^-$-type region 55 for steepening a bottom of impurity concentration profile of a channel layer 52, and the channel layer 52 made of an n-type impurity region. Source region 56 and drain region 57 formed as high concentration n-type impurity regions are disposed adjacently to the channel layer 52.

Note that FIG. 1B shows one set of the source and drain regions 56 and 57 and the channel layer 52. However, in reality, operating region 50 of the FET is formed as indicated with dashed dotted lines in FIG. 1A by means of arranging a plurality of sets adjacently to one another while using the source region 56 or the drain region 57 in common.

A first source electrode 65 and a first drain electrode 66 made of an ohmic metal layer 64 (AuGe/Ni/Au) as a first metal layer are provided on the source region 56 and the drain region 57.

Meanwhile, a gate metal layer 68 (Pt/Mo) as a second metal layer is contacted to the channel layer 52, thereby providing gate electrode 69. Moreover, a second source electrode 75 and a second drain electrode 76 made of pad metal layer 74 (Ti/Pt/Au) are provided on the first source electrode 65 and the first drain electrode 66. The source electrode 75, the drain electrode 76, and the gate electrode 69 are arranged in the form of engaging comb teeth with one another, thereby constituting the FET.

Here, the gate electrode 69 constitutes a buried gate electrode which is partially buried in the channel layer 52 while maintaining a Schottky junction with the substrate. A surface of the channel layer 52 (in a depth of about 500 Å to 1000 Å from the surface, for example) is a region where a natural depletion layer is generated or crystals are not uniform. Accordingly, the surface of the channel layer 52 does not allow a current to flow and is not therefore effective as a channel.

Therefore, a portion immediately below the gate electrode 69 for allowing the current to flow is lowered relative to the surface of the channel layer 52 by burying part of the gate electrode 69 in the channel layer 52. In this way, it is possible to utilize the channel effectively.

The channel layer 52 is deeply formed in advance in consideration of the portion of the gate electrode 69 to be buried in order to obtain desired FET characteristics. To be more precise, there are advantages of substantially improving current density, channel resistance, and a high frequency distortion characteristic of the FET.

Moreover, oxide film 120 is provided on nitride film 72 so as to overlap end portions of the source region 56 and of the drain region 57. As details will be described later, the oxide film 120 is used for mask alignment of the first source electrode 65, the first drain electrode 66, and the gate electrode 69 directly with the source region 56 and the drain region 57.

A pad electrode 77 is formed by directly contacting the pad metal layer 74 extending from the FET to the surface of the substrate. A high frequency analog signal is transmitted on the pad electrode 77. On the surface of the substrate around the pad electrode 77, a high concentration impurity region 60 is provided so as to be separated from the pad electrode 77. Here, the high concentration impurity region 60 (and a high concentration impurity region 61 similarly) has impurity concentration equal to or above $1 \times 10^{17}$ cm$^{-3}$, and is connected to the pad electrode 77 in direct current mode. That is, there is a separation between the high concentration impurity region 60 and the pad electrode 77 in a range from about 0.1 μm to 5 μm. However, direct currents can still run between the high concentration impurity region 60 and the pad electrode 77 because the separation is sufficiently small.

If a metal layer such as the pad electrode is directly provided on the GaAs substrate, a depletion layer reaches an adjacent electrode or wiring layer due to variation in a distance of the depletion layer in response to a high frequency signal. Leakage of a high frequency signal is likely to occur in a space between metal layers where such a depletion layer reaches.

However, by providing the n-type high concentration impurity region 60 on the surface of the substrate 51 around the pad electrode 77, the impurity concentration is raised (the species of ion is $^{29}$Si$^+$, and the concentration is 1 to $5 \times 10^{18}$ cm$^{-3}$) unlike the surface of the substrate 51 not doped with an impurity (which is semi-insulating and has a resistance value of the substrate equal to or above $1 \times 10^7$ Ωcm). In this way, the pad electrode 77 is electrically isolated from the substrate 51, and a depletion layer does not extend toward the adjacent gate wiring 62, for example. Accordingly, it is possible to ensure sufficient isolation. Therefore, it is possible to provide the pad electrode 77 directly on the GaAs substrate 51 by providing the high concentration impurity region 60 on the surface of the substrate 51 around the pad electrode 77. The high concentration impurity region 60 is also disposed around the gate wiring 62 bundling the comb teeth of the gate electrode 69 due to the same reason, and the high concentration impurity region 60 is connected to the gate wiring 62 in direct current mode.

Here, in the case of FIG. 1B, the oxide film 120 is also provided on the high concentration impurity region 60. This will also be described later.

Meanwhile, pad wiring 78 made of the pad metal layer 74 extends on nitride film 72 provided on the substrate 51 and connects the operating region 50 of the FET to the pad electrode 77.

Moreover, it is preferable to dispose the high concentration impurity region 60 also on the surface of the substrate 51 around the pad wiring 78 as shown in FIG. 1B. Here, the high concentration impurity region 60 is disposed so as to be connected to the pad electrode 77 or the gate wiring 62 in direct current mode. However, the high concentration impurity region 60 having floating potential, to which no direct current potential is applied, may be disposed around the pad metal layer 74 in a position not adjacent to the pad electrode 77 or the gate wiring 62. In a region where the pad wiring 78 for transmitting the high frequency analog signal is disposed, the nitride film 72 becomes a capacitive element, whereby the high frequency signal passes through the nitride film 72 to the substrate 51. Accordingly, it is possible to prevent leakage of the high frequency signal by providing the high concentration impurity region 60 having the floating potential so as to block extension of the depletion layer.

Here, the high concentration impurity region 60 is the region for preventing leakage of the high frequency signal between the pad electrode 77 and another formation element (the gate wiring 62, the pad wiring 78 or the impurity region such as the source region 56 or drain region 57). Accordingly, it is only necessary that the high concentration impurity region 20 is disposed between the two of these formation elements adjacent to each other.

That is, the high concentration impurity region 60 only needs to be disposed in a small space between the pad electrode 77 and any of the pad wiring 78 and the gate wiring 62 around the pad electrode 77. In this way, it is possible to suppress leakage of the high frequency signal with a small space and to omit the nitride film below the pad electrode 77.

Moreover, the pad electrode 77 of this embodiment has the structure in which the pad metal layer 74 is directly contacted to the substrate 51. That is, instead of providing the gate metal layer conventionally formed as the pad electrode of the first layer, the pad electrode 77 is formed solely by use of the pad metal layer 74. In this way, it is possible to prevent adverse effects to the pad electrode 77 attributing to hardening of the buried metal even in the structure configured to bury part of the gate electrode 69 into the surface of the channel layer to enhance the characteristics of the FET.

When there is no hardened metal layer, it is possible to prevent defects at the time of wire bonding and to suppress deterioration in yields and reliability because the pad metal layer 74 per se is found to be the metal layer sufficiently suitable for wire bonding.

Figure 1C:
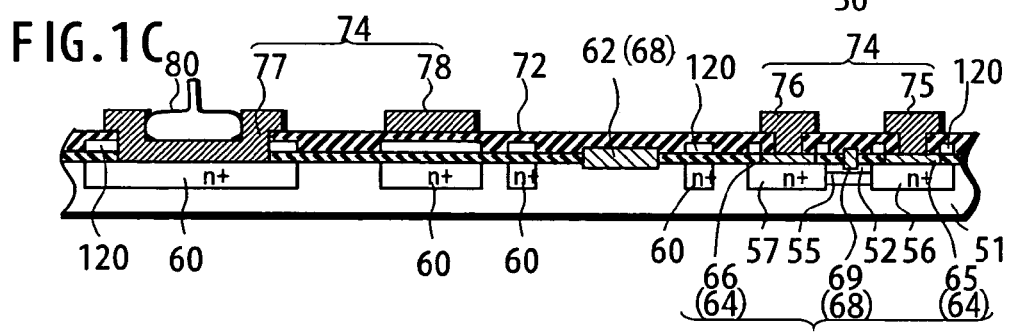
Figure 1D:
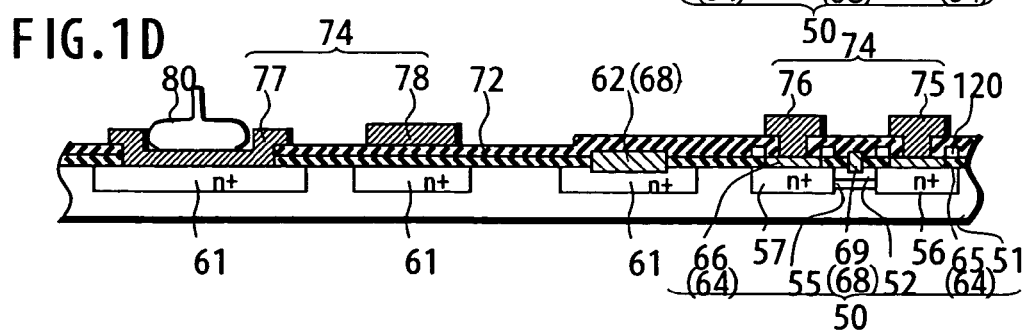
Figure 2:
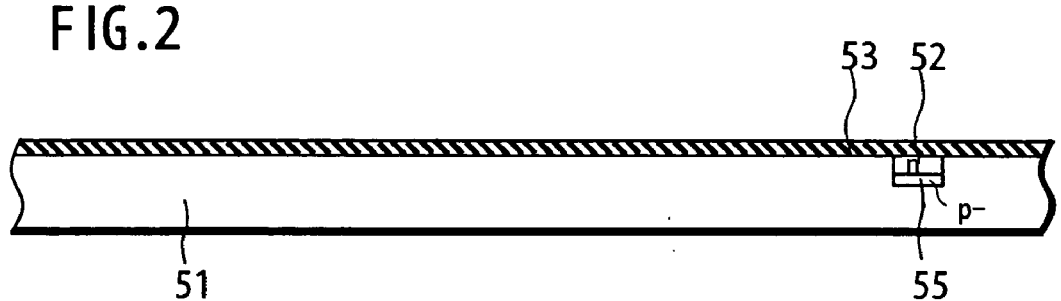
FIG. 2 is a cross-sectional view for describing a first embodiment of the present invention.

FIGS. 1C and 1D are cross-sectional views showing other patterns of the high concentration impurity regions 60 and 61 correspond to the line a-a of FIG. 1A. The high concentration impurity regions 60 and 61 for suppressing leakage of the high frequency signal may be provided on the surface of the substrate 51 below the entire surface of the pad electrode 77 so as to protrude out of the pad electrode 77.

Although details will be described later, FIG. 1C shows a case where the high concentration impurity region 60 is formed in the same step of forming the source region 56 and the drain region 57, in which the oxide film 120 is disposed partially on the high concentration impurity region 60. On the contrary, FIG. 1D shows a case where the high concentration impurity region 60 is formed in a different step from the step of forming the source region 56 and the drain region 57, in which the oxide film 120 is not formed on the high concentration impurity region 61.

Moreover, in these cases, the high concentration impurity regions 60 and 61 may be provided only in the periphery of the pad electrode 77 on the surface of the substrate 51 so as to protrude out of the pad electrode 77 instead of the region corresponding to below the entire surface of the pad electrode 77.

Here, a slightly larger space may be required as compared to the case shown in FIG. 1B when the high concentration impurity regions 60 and 61 below the pad electrode 77 are provided so as to protrude out of the pad electrode 77 as shown in FIGS. 1C and 1D. However, such configurations have larger effects to prevent leakage of the high frequency signal. This fact also applies to the high concentration impurity regions 60 and 61 below the pad wiring 78.

Here, the gate wiring 62 partially buried into the surface of the substrate 51 together with the gate electrode 78 may cause an increase in a leak current in direct current mode. For this reason, it is preferable to dispose the high concentration impurity region 61 below the entire surface of the gate wiring 62 as shown in FIG. 1D.

A manufacturing method of a compound semiconductor device according to an embodiment of the invention will be described with reference to FIG. 2 to FIG. 16.

A method of manufacturing a compound semiconductor device according to the embodiment of the invention includes the steps of forming a channel layer on a surface of a compound semiconductor substrate, forming source and drain regions adjacently to the channel layer, forming a high concentration impurity region on the surface of the substrate around or below a pad electrode formation region, forming a first source electrode and a first drain electrode by depositing an ohmic metal layer constituting electrodes of a first metal layer onto the source and drain regions, forming a gate electrode by depositing a gate metal layer constituting an electrode of a second metal layer onto the channel layer, forming a second source electrode and a second drain electrode by depositing a pad metal layer constituting electrodes of a third metal layer onto surfaces of the first source electrode and of the first drain electrode as well as on the surface of the substrate in the pad electrode formation region and then forming a pad electrode connected to the high concentration impurity region in direct current mode, and bonding a bonding wire onto the pad electrode.

To begin with, FIG. 2 to FIG. 7C show a first embodiment. The first embodiment intends to form the high concentration impurity region to be connected to the pad electrode in the vicinity of the pad electrode simultaneously in the step of forming the source region and the drain region, which is equivalent to the manufacturing method shown in FIG. 1B.

First step (FIG. 2): The entire surface of compound semiconductor substrate 51 made of GaAs or the like is covered with a silicon nitride film 53 for through-ion implantation in a thickness from about 100 Å to 200 Å. Next, an alignment mark (not shown) is formed by etching either the outermost periphery of a chip or GaAs in a predetermined region on a mask. Subsequently, a photolithography process is performed to selectively form an opening on a resist layer (not shown) above a formation region for the channel layer 52. Thereafter, ions of a p$^-$-type impurity ($^{24}$Mg$^+$) are implanted for steepening a bottom of a channel impurity concentration profile while using this resist layer as a mask, and then ions of an n-type impurity ($^{29}$Si$^+$) are continuously implanted for forming the channel layer 52.

As a result, p⁻-type region 55 is formed on the undoped substrate 51 and the n-type channel layer 52 is formed on the p⁻-type region 55.

Figure 3:
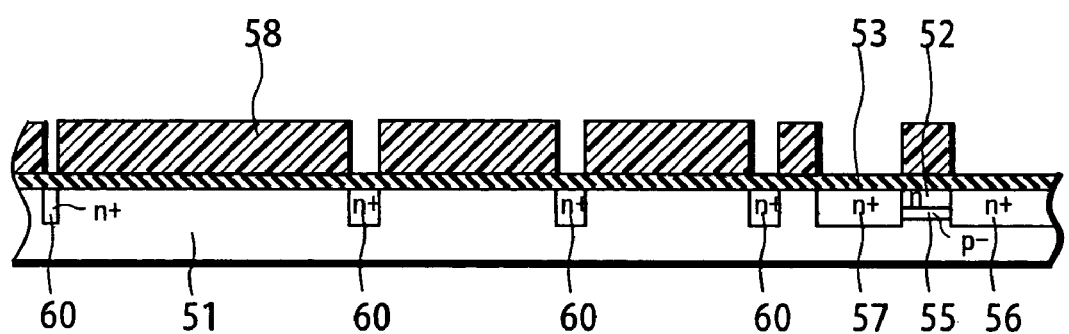
FIG. 3 is a cross-sectional view for describing the first embodiment of the present invention.

Second and third steps (FIG. 3 to FIG. 4B): As shown in FIG. 3, the resist layer used in the precedent step is removed and the entire surface is covered with the silicon nitride film 53 for cap annealing. New resist layer 58 is provided and a photolithography process is performed to selectively form openings in the resist layer 58 respective formation regions for source region 56, drain region 57, high concentration impurity region 60 (on the surface of the substrate 51 around pad electrode 77, gate wiring 62, and pad wiring 78, respectively), and alignment mark 130. Subsequently, ions of an n-type impurity ($^{29}Si^+$) equal to or above $1 \times 10^{17}$ cm$^{-3}$ are implanted on the surface of the substrate 51 in the respective formation regions of the source region 56, the drain region 57, and the alignment mark 130 and on the surface of the substrate 51 in the vicinities of the respective formation regions for gate wiring 62, the pad wiring 78, and the pad electrode 77 while using the resist layer 58 as a mask.

In this way, the n⁺-type source region 56 and drain region 57 are formed adjacently to the channel layer 52, and the high concentration impurity region 60 is simultaneously formed on the surface of the substrate 51 in the vicinities of the formation regions for the pad electrode 77, the gate wiring 62, and the pad wiring 78. The high concentration impurity region 60 is the region to be connected to the pad electrode 77 and the gate wiring 62 in direct current mode, which is provided on the surface of the substrate 51 so as to be separated from the pad electrode 77 and from the gate wiring 62 with a space in a range from 0.1 μm to 5 μm.

Meanwhile, when there is the pad wiring 78 in a region not adjacent to the pad electrode 77 or the gate wiring 62, for example, the high concentration impurity region 60 formed in the vicinity of the pad wiring 78 has the floating potential to which no direct current potential is applied.

As described above, by use of the high concentration impurity region 60, it is possible to suppress a depletion layer extending from the pad electrode (as well as the gate wiring 62 and the pad wiring 78) to be formed in the subsequent step toward the substrate 51, and to prevent leakage of the high frequency signal.

Moreover, the high concentration impurity region 60 is also formed on the surface of the substrate in the formation region for the alignment mark 130.

Figure 4A:
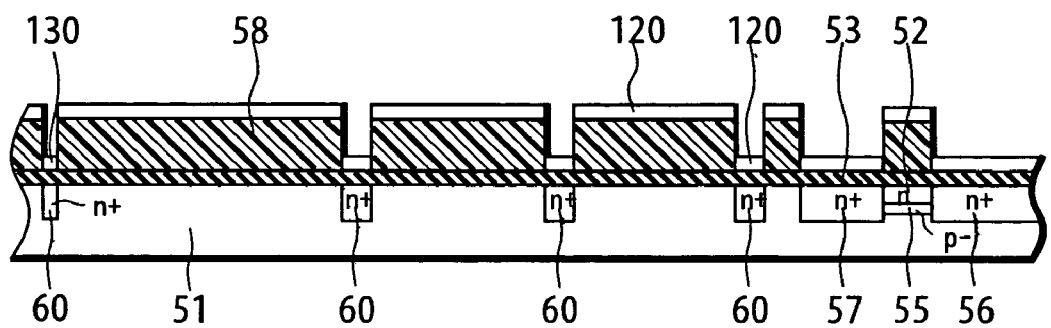
FIGS. 4A and 4B are cross-sectional views for describing the first embodiment of the present invention.
Figure 4B:
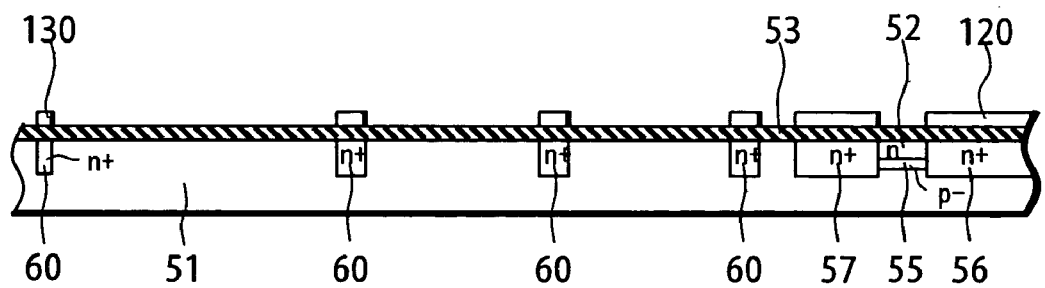

In addition, an insulating film for the alignment mark is formed as shown in FIGS. 4A and 4B. Oxide film 120 is deposited on the entire surface of the resultant structure while leaving the resist 58 used for forming the high concentration impurity region 60 (FIG. 4A). Thereafter, the resist 58 is removed by use of the lift-off method, and the oxide film 120 is thereby left on part of the source region 56, the drain region 57, and the high concentration impurity region 60 (FIG. 4B). In FIGS. 4A and 4B, the oxide film 120 is also left on the opening portion at the left end, which is opened in the resist 58 for the alignment mark. The oxide film 120 of the opening portion will be used as the alignment mark 130 in the following steps.

Next, the p⁻-type region 55, the n-type channel layer 52, and the n⁺-type regions constituting the source region 56, the drain region 57, and the high concentration impurity region 60 are subjected to activation annealing.

Fourth step (FIGS. 5A and 5B): In this step, the first source and first drain electrodes are formed in the source and drain regions 56 and 57 in accordance with a photolithography process while performing mask alignment by use of the alignment mark 130.

Figure 5A:
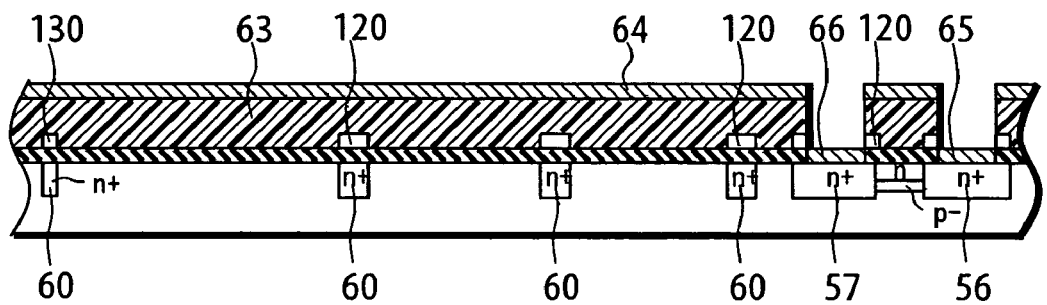
FIGS. 5A and 5B are cross-sectional views for describing the first embodiment of the present invention.

Firstly, as shown in FIG. 5A, new resist layer 63 is provided again and a photolithography process is performed to selectively form openings for formation regions for first source electrode 65 and first drain electrode 66. The exposed oxide film 120 and the silicon nitride film 53 therebelow are removed by $CF_4$ plasma to expose the source region 56 and the drain region 57, and subsequently, three layers of AuGe/Ni/Au collectively constituting ohmic metal layer 64 are sequentially evaporated by vacuum evaporation.

Figure 5B:
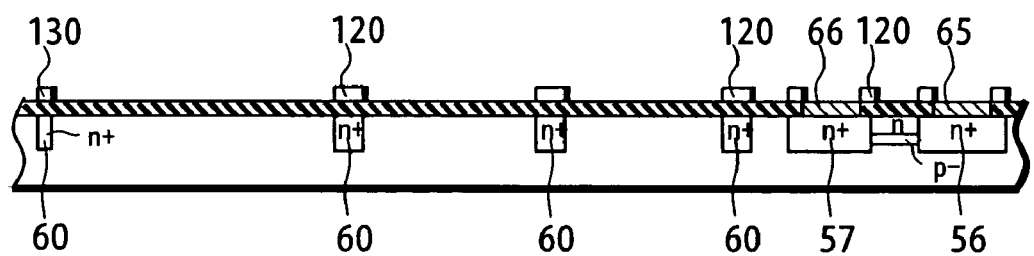

Thereafter, as shown in FIG. 5B, the resist layer 63 is removed and the first source electrode 65 and the first drain electrode 66 are left on the source region 56 and the drain region 57 in contact by the lift-off method. Subsequently, ohmic junctions between the first source electrode 65 and the source region 56 and between the first drain electrode 66 and the drain region 57 are formed by an alloying heat treatment.

By leaving the oxide film 120 on the source region 56 and the drain region 57 simultaneously with formation of the alignment mark 130, it is possible to perform mask alignment directly between the source region 56 and the first source electrode 65 and between the drain region 57 and the first drain electrode 66. Therefore, an accuracy level in mask alignment between the first source electrode 65 and the source region 56 (similarly applicable to the first drain electrode and drain region) is equivalent to mask alignment accuracy level of a mask aligner. That is, it is possible to suppress the error within 0.1 μm at the maximum and to reduce a distance between an end of the first source electrode 65 and an end of the source region 56 (similarly applicable to the first drain electrode and the drain region). In this way, it is possible to contribute largely to increase of a saturation current and to reduction of on resistance value of the FET.

Figure 6A:
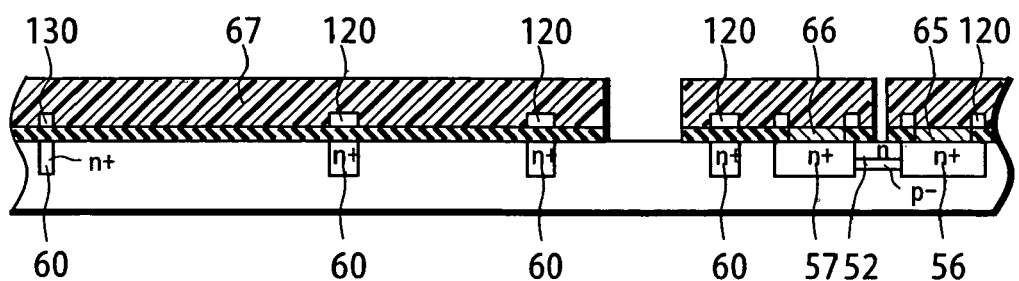
FIGS. 6A to 6C are cross-sectional views for describing the first embodiment of the present invention.

Fifth step (FIGS. 6A to 6C): Firstly, as shown in FIG. 6A, new resist layer 67 is formed and mask alignment is performed by use of the alignment mask 130. Then, a photolithography process is performed to selectively form openings for respective formation regions for gate electrode 69 and the gate wiring 62. The silicon nitride film 53 exposed in the formation regions for the gate electrode 69 and the gate wiring 62 is subjected to dry etching, thereby exposing the channel layer 52 in the formation region for the gate electrode 69 and exposing the substrate 51 in the formation region for the gate wiring 62.

Figure 6B:
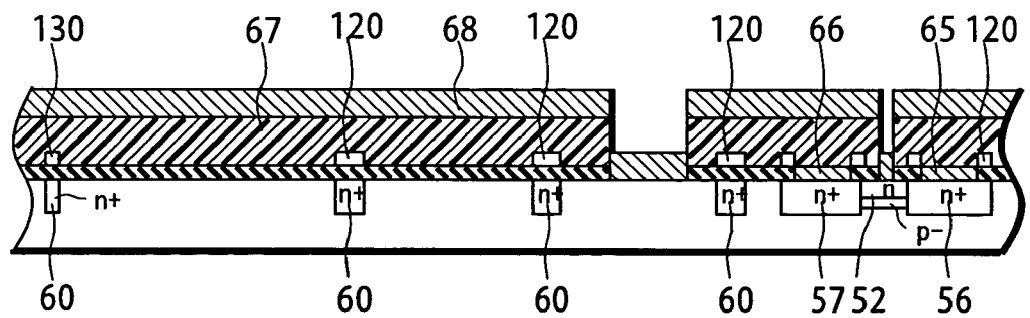

As shown in FIG. 6B, two layers of Pt/Mo collectively constituting buried gate metal layer 68 as the electrodes of the second metal layer are sequentially evaporated on the substrate 51 by vacuum evaporation. Thereafter, the resist layer 67 is removed and then the gate electrode 69 and the gate wiring 62 contacting the channel layer 52 are formed by the lift-off method.

Figure 6C:
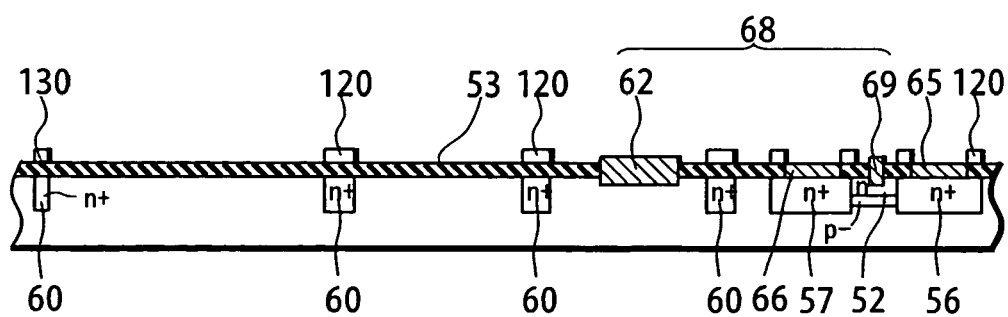

Thereafter, a heat treatment for burying Pt of the lowermost layer of the gate metal layer 68 is performed as shown in FIG. 6C. In this way, part of the gate electrode 69 is buried in the channel layer 52 while maintaining a Schottky junction with the substrate 51. Here, the channel layer 52 is formed in a sufficient depth in the first step of forming the channel layer 52 in consideration of the portion of the buried gate electrode so as to obtain desired FET characteristics.

In this way, it is possible to form the gate electrode 69 such that the channel functions efficiently. Accordingly, there are advantages of substantially improving current density, channel resistance, and a high frequency distortion characteristic. Moreover, the gate electrode 69, the source region 56, and the drain region 57 are directly subjected to mask alignment by use of the alignment mark 130. In this way, an accuracy level in mask alignment among the gate electrode 69, the source region 56, and the drain region 57 is equivalent to the mask alignment accuracy of the mask aligner, which can be suppressed within 0.1 µm at the maximum. Therefore, it is possible to reduce distances between the gate electrode 69 and the source region 56 and between the gate electrode 69 and the drain region 57. In this way, it is possible to contribute largely to increase of a saturation current and reduction of on resistance value of the FET.

Although the gate wiring 62 is buried into the surface of the substrate 51 and is partially hardened, such hardening causes no problem as any external force such as wire bonding is not applied to the gate wiring 62.

Figure 7A:
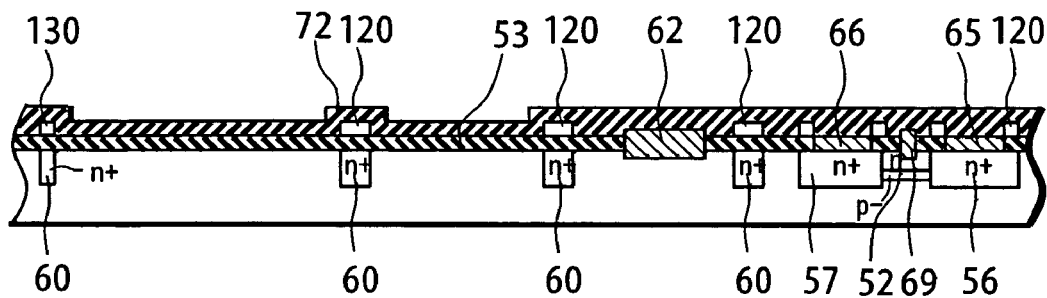
FIGS. 7A to 7C are cross-sectional views for describing the first embodiment of the present invention.

Sixth step (FIGS. 7A to 7C): After forming the gate electrode 69 and the gate wiring 62, the surface of the substrate 51 is covered with passivation film 72 made of a silicon nitride film in order to protect the channel layer 52 around the gate electrode 69 as shown in FIG. 7A.

Figure 7B:
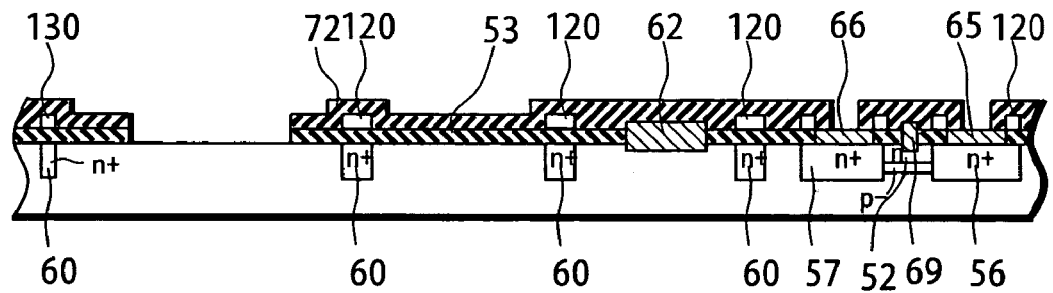

Next, as shown in FIG. 7B, a resist layer (not shown) is provided on this passivation film 72, and a photolithography process is performed to selectively form openings in the resist layer corresponding to contact portions of the first source electrode 65 and the first drain electrode 66, and the passivation film 72 at the portions is subjected to dry etching.

Simultaneously, an opening is selectively formed in the resist layer corresponding to the pad electrode formation region, and the passivation film 72 and the nitride film 53 at the portion are subjected to dry etching. Then, the resist layer is removed.

In this way, contact holes are formed on the passivation film 72 above the first source electrode 65 and above the first drain electrode 66, and the surface of the substrate 51 for the formation region for the pad electrode 77 is exposed.

Figure 7C:
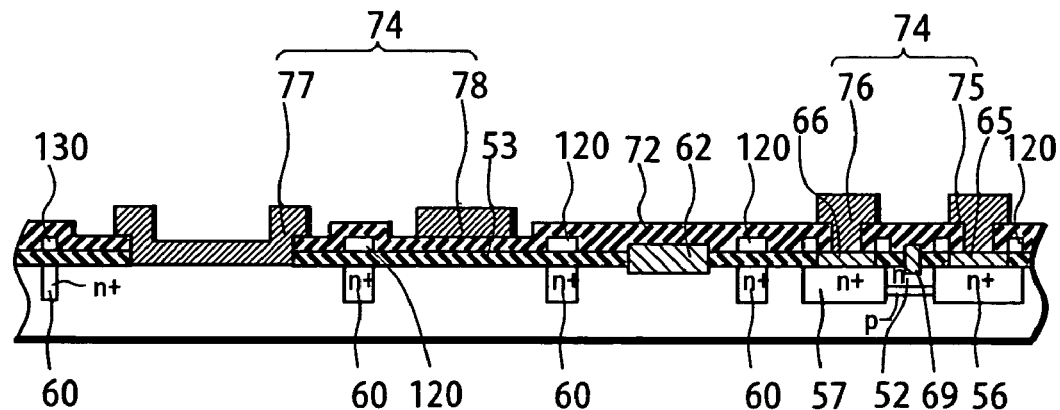
Figure 9:
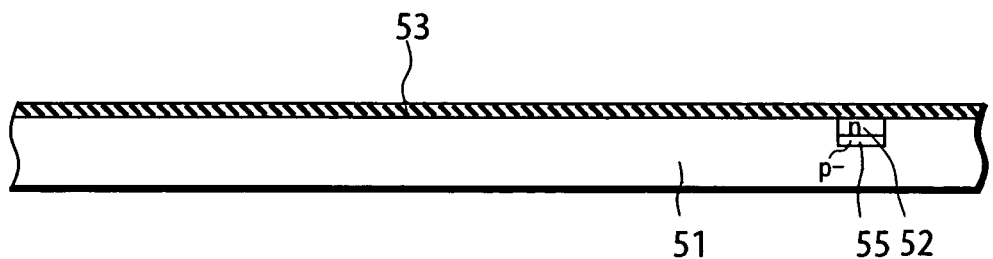
FIG. 9 is a cross-sectional view for describing a third embodiment of the present invention.

Moreover, as shown in FIG. 7C, a new resist layer (not shown) is coated on the entire surface of the substrate 51, and a photolithography process is performed to selectively form openings in the resist above respective formation regions for second source electrode 75, second drain electrode 76, the pad electrode 77, and the pad wiring 78.

Subsequently, three layers of Ti/Pt/Au collectively constituting pad metal layer 74 as electrodes of the third metal layer are sequentially evaporated by vacuum evaporation. After removing the resist layer, the second source electrode 75 and the second drain electrode 76 contacting the first source electrode 65 and the first drain electrode 66 are formed by the lift-off method.

Simultaneously, the pad electrode 77 is formed so as to be contacted directly to the substrate 51, and then the pad wiring 78 in a given pattern is formed on the nitride film 72. In FIG. 7C, the pad electrode 77 for transmitting the high frequency analog signal is separated from the high concentration impurity region 60 provided in the vicinity thereof at a distance of about 4 µm, and is connected thereto in direct current mode. Moreover, the nitride films 72 and 53 are disposed below the pad wiring 78. For this reason, when the high frequency signal passes through the pad wiring 78, the nitride films 72 and 53 become capacitive elements, and the high frequency signal leaks out to the substrate. However, by disposing the high concentration impurity region 60 in the vicinity of the pad wiring 78 as described in this embodiment, it is possible to prevent leakage of the high frequency signal without connection in direct current mode.

Seventh step (FIG. 1B): The step of bonding a bonding wire onto the pad electrode.

After completion of the above-described wafer process, the compound semiconductor switching circuit device is subjected to a assembly process for assembly. The semiconductor wafer is diced and separated into individual semiconductor chips. After bonding each semiconductor chip to a frame (not shown), the pad electrode 77 of the semiconductor chip is connected to a given lead (not shown) with bonding wire 80. A gold thin wire is used as the bonding wire 80, and connection is achieved by publicly known ball bonding. Thereafter, resin packaging is performed by transfer molding.

In this embodiment, the pad electrode 77 is solely made of the pad metal layer 74. That is, the gate metal layer 68 is not disposed therebelow unlike the conventional art. Accordingly, when forming the FET of the buried gate electrode structure, the pad electrode 77 is not adversely affected even if part of the gate metal layer is hardened. Since the pad metal layer 74 per se is found to be originally made of a material suitable for wire boding, it is possible to achieve fine bonding when the hardened metal layer is not disposed.

Next, a second embodiment of the manufacturing method of the present invention will be described with reference to FIGS. 8A to 8E. The second embodiment intends to form the high concentration impurity region 60 on the entire surface below pad electrode 77 simultaneously with source region 56 and drain region 57, which is equivalent to the manufacturing method shown in FIG. 1C. Here, detailed description will be omitted in terms of portions overlapping the first embodiment.

First to third steps (FIG. 8A): Same as the first embodiment, after forming channel layer 52 on a substrate 51, resist 58 is formed and a photolithography process is performed to selectively form openings in the resist layer 58 in the respective formation regions for the source region 56, the drain region 57, high concentration impurity region 60, and alignment mark 130. Subsequently, ions of an n-type impurity ($^{29}Si^+$, impurity concentration equal to or above $1 \times 10^{17}$ $cm^{-3}$) are implanted on the surface of the substrate 51 in the formation regions for the source region 56, the drain region 57, the high concentration impurity region 60, and the alignment mark 130 while using this resist layer 58 as a mask.

In this way, the $n^+$-type source region 56 and drain region 57 are formed adjacently to a channel layer 52. Meanwhile, the high concentration impurity region 60 is formed on the surface of the substrate 51 around the formation region for the gate wiring 62. At the same time, the high concentration impurity regions 60 are formed on the surface of the substrate 51 below the formation regions for the pad electrode 77 and pad wiring 78, respectively. The high concentration impurity region 60 overlaps the pad electrode 77 and the pad wiring 78. Moreover, the high concentration impurity regions 60 are formed so as to protrude out of these formation regions. The high concentration impurity region is also formed on the surface of the substrate 51 in the formation region for the alignment mark 130.

In addition, an ohmic electrode is formed as shown in FIG. 8B. Firstly, to form an insulating film for the alignment mark, oxide film 120 is deposited on the entire surface while leaving the resist 58. Thereafter, by removing the resist 58 by the lift-off method, the oxide film 120 is left on part of the source region 56, the drain region 57, and the high concentration impurity region 60. In FIG. 8B, the oxide film 120 is also left at the portion in the resist 58 opened for the alignment mark on the left end, which will be used as the alignment mark 130 in the following steps.

Next, a p⁻-type region 55, the n-type channel layer 52, and the n⁺-type regions constituting the source region 56, the drain region 57, and the high concentration impurity region 60 are subjected to activation annealing.

In addition, a new resist layer (not shown) is provided and a photolithography process is performed to remove the oxide film 120 and nitride film 53 in the formation regions for a first source electrode and a first drain electrode. Then, three layers of AuGe/Ni/Au collectively constituting ohmic metal layer 64 are sequentially evaporated by vacuum evaporation.

Thereafter, a first source electrode 65 and a first drain electrode 66 are left on the source region 56 and the drain region 57 in contact by the lift-off method. Subsequently, ohmic junctions between the first source electrode 65 and the source region 56 and between the first drain electrode 66 and the drain region 57 are formed by an alloying heat treatment.

Fifth and sixth steps: After forming buried gate electrode 69 and the gate wiring 62 in the fifth step of same as the first embodiment, the surface of substrate 51 is covered with passivation film 72 made of a silicon nitride film as shown in FIG. 8C.

Next, as shown in FIG. 8D, a photolithography process is performed on this passivation film 72 to selectively form openings on contact portions of the first source electrode 65 and the first drain electrode 66, thereby subjecting the passivation film 72 at those portions to dry etching. Simultaneously, an opening is selectively formed in the formation region for the pad electrode 77, thereby subjecting the passivation film 72, the oxide film 120, and the nitride film 53 at that portion to dry etching. In this case, the nitride films 72 and 53, and the oxide film 120 can be continuously removed by $CF_4$ plasma.

In this way, the contact holes are formed in the passivation film 72 above the first source electrode 65 and the first drain electrode 66, and the surface of substrate 51 (the high concentration impurity region 60) in the formation region for the pad electrode 77 is thereby exposed.

Moreover, as shown in FIG. 8E, a new resist layer (not shown) is coated on the entire surface of the substrate 51, and a photolithography process is performed to selectively form openings in the resist above the respective formation regions for second source electrode 75, second drain electrode 76, the pad electrode 77, and the pad wiring 78.

Subsequently, three layers of Ti/Pt/Au collectively constituting pad metal layer 74 as the electrodes of the third metal layer are sequentially evaporated by vacuum evaporation. After removing the resist layer, the second source electrode 75 and the second drain electrode 76 contacting the first source electrode 65 and the first drain electrode 66 are formed by the lift-off method.

Simultaneously, the pad electrode 77 is formed so as to be contacted directly to the high concentration impurity region 60, and then the pad wiring 78 in a given pattern is formed on the oxide film 120 and on the nitride film 72. The high concentration impurity region 60 protrudes out of the pad electrode 77, whereby the entire surface of the pad electrode 77 is directly contacted to the high concentration impurity region 60 and is connected in direct current mode.

In the second embodiment, the high concentration impurity region 60 having the floating potential is also formed below the pad wiring 78. In this case, the nitride film 72, the oxide film 120, and the nitride film 53 are disposed below the pad wiring 78. Accordingly, when the high frequency signal passes through the pad wiring 78, the nitride films 72 and 53 and the oxide film become capacitive elements and the high frequency signal leaks out to the substrate 51. However, by providing the high concentration impurity region 60 having the floating potential to which no direct current potential is applied, it is possible to prevent leakage of the high frequency signal from the pad wiring 78 to the substrate 51 more effectively.

Here, the high concentration impurity region 60 below the pad electrode 77 may be provided only in the vicinity of the pad electrode 77 and formed into a pattern such that the pad electrode 77 partially contacts the high concentration impurity region 60.

Next, a third embodiment will be described with reference to FIG. 9A to FIG. 13. The third embodiment intends to form a high concentration impurity region to be connected to a pad electrode in a different step from the step of forming a source region and a drain region, which is equivalent to the manufacturing method shown in FIG. 1D. Here, detailed description will be omitted in terms of portions overlapping the first embodiment.

First step (FIG. 9): The entire surface of compound semiconductor substrate 51 made of GaAs or the like is covered with silicon nitride film 53 for through-ion implantation, and an alignment mark (not shown) is formed by etching either the outermost periphery of a chip or GaAs in a predetermined region on a mask. Next, ions of a p⁻-type impurity ($^{24}Mg^+$) for steepening a bottom of a channel impurity concentration profile are implanted while using a resist layer (not shown) formed in a photolithography process as a mask. Subsequently, ions of an n-type impurity ($^{29}Si^+$) for forming a channel layer 52 are implanted. As a result, p⁻-type region 55 is formed on the undoped substrate 51 and n-type channel layer 52 is formed on the p⁻-type region 55.

Figure 10:
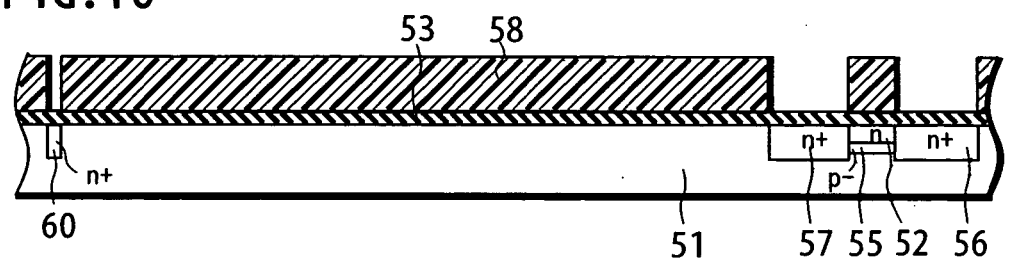
FIG. 10 is a cross-sectional view for describing the third embodiment of the present invention.

Second step (FIG. 10 to FIG. 11B): As shown in FIG. 10, new resist layer 58 is provided and a photolithography process is performed to selectively form openings in the resist layer 58 on the respective formation regions for source region 56, drain region 57, and alignment mark 130. Subsequently, ions of an n-type impurity ($^{29}Si^+$) are implanted on the surface of the substrate 51 in the respective formation regions for the source region 56, the drain region 57, and the alignment mark 130 while using this resist layer 58 as a mask.

In this way, the n⁺-type source region 56 and drain region 57 are formed adjacently to the channel layer 52, and high concentration impurity region 60 is simultaneously formed on the surface of the substrate 51 in the formation regions for the alignment mark 130.

Figure 11A:
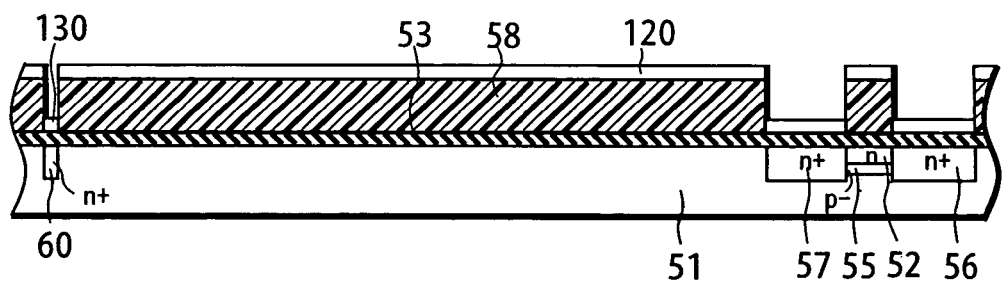
FIGS. 11A and 11B are cross-sectional views for describing the third embodiment of the present invention.
Figure 11B:
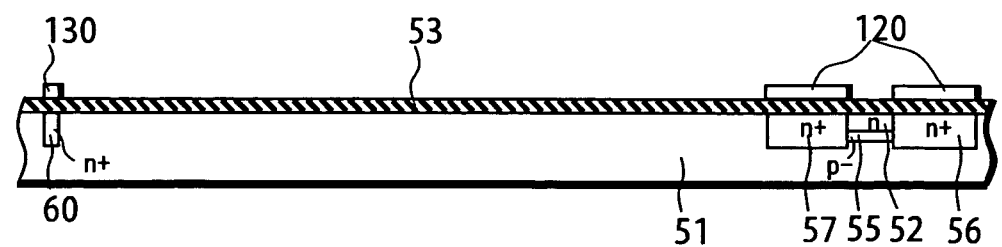
Figure 12:
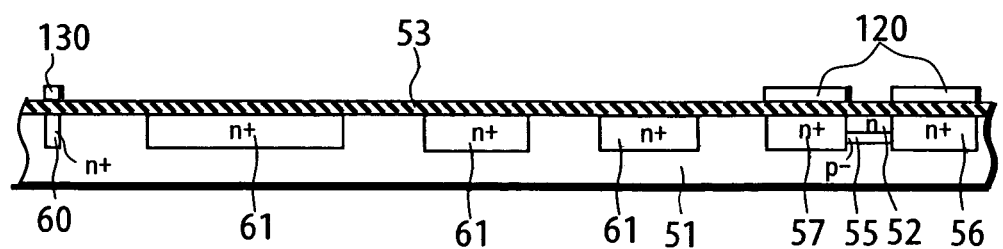
FIG. 12 is a cross-sectional view for describing the third embodiment of the present invention.
Figure 13:
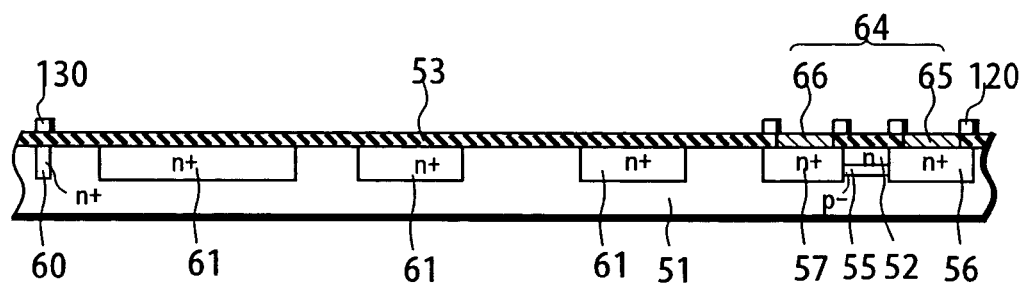
FIG. 13 is a cross-sectional view for describing the third embodiment of the present invention.

Next, the insulating film for the alignment mark is formed as shown in FIGS. 11A and 11B. Oxide film 120 is deposited on the entire surface while leaving the resist 58 used for forming the source region 56 and the drain region 57 (FIG. 11A). Thereafter, the resist 58 is removed by use of the lift-off method, and the oxide film 120 is thereby left on part of the source region 56 and the drain region 57. In FIG. 11B, the oxide film 120 is left on the opening portion at the left end, which is formed in the resist 58 for the alignment mark. The oxide film 120 of the portion will be used as the alignment mark 130 in the following steps (FIG. 11B).

Third step (FIG. 12): The resist layer used in the precedent step is removed and a new resist layer (not shown) is provided. Then, a photolithography process is performed to selectively form openings in the resist layer in formation regions of high concentration impurity region 61, that is, the surface of the substrate 51 respectively below pad electrode 77, gate wiring 62, and pad wiring 78. In this case, the high concentration impurity region 61 is formed below the entire surface of the pad electrode so as to overlap the pad electrode 77, and a pattern is formed such that the high concentration impurity region 61 protrudes out of the pad electrode 77. The high concentration impurity region 61 is formed similarly in terms of the gate wiring 62 and the pad wiring 78.

Subsequently, ions of an n-type impurity ($^{29}$Si+, impurity concentration equal to or above $1\times10^{17}$ cm$^{-3}$) are implanted in the formation regions for the pad electrode 77, the gate wiring 62, and the pad wiring 78 as well as the surface of the substrate 51 in the vicinities thereof while using this resist layer as a mask.

In this way, the high concentration impurity region 61 is formed on the surface of the substrate 51 below the pad electrode 77, the gate wiring 62, and the pad wiring 78. The high concentration impurity region 61 is directly connected to the pad electrode 77 and the gate wiring 62. That is, the high concentration impurity region 61 is formed on the surface of the substrate 51 so as to contact the entire surface of the pad electrode 77 (and the gate wiring 62) and to partially protrude out of the pad electrode 77 (and the gate wiring 62).

Meanwhile, the high concentration impurity region 61 is also provided below the entire surface of the pad wiring 78 through the nitride film 53. In this case, the high concentration impurity region 61 has the floating potential to which no direct current potential is applied.

After removing the resist, activation annealing is performed on the p$^-$-type region 55, the n-type channel layer 52, and the n$^+$-type region constituting the source region 56, the drain region 57, and the high concentration impurity region 60 and 61 subjected to ion implantation.

Fourth step (FIG. 13): The oxide film 120 and the nitride film 53 are removed by a photoetching process, and the source region 56 and the drain region 57 are exposed. Then, three layers of AuGe/Ni/Au collectively constituting ohmic metal layer 64 are sequentially evaporated by vacuum evaporation.

Thereafter, first source electrode 65 and first drain electrode 66 are left on the source region 56 and the drain region 57 in contact by the lift-off method. Subsequently, ohmic junctions between the first source electrode 65 and the source region 56 and between the first drain electrode 66 and the drain region 57 are formed by an alloying heat treatment.

Figure 14A:
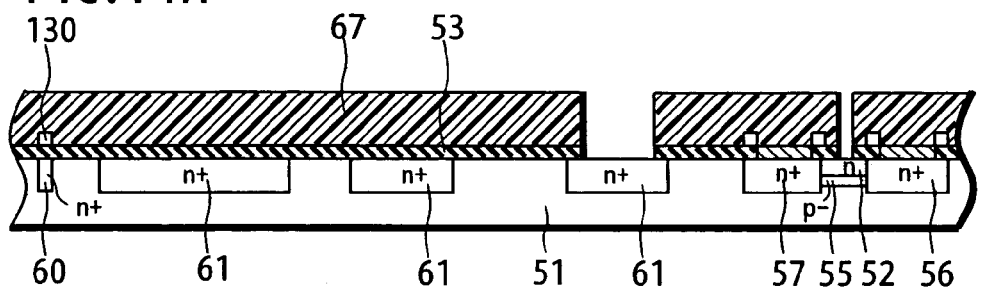
FIGS. 14A to 14C are cross-sectional views for describing the third embodiment of the present invention.

Fifth step (FIGS. 14A to 14C): Firstly, as shown in FIG. 14A, new resist layer 67 is formed and mask alignment is performed by use of the alignment mark 130. Then, a photolithography process is performed to selectively form openings in the formation regions for gate electrode 69 and the gate wiring 62. The silicon nitride film 53 exposed in the formation regions for the gate electrode 69 and the gate wiring 62 is subjected to dry etching, thereby exposing the channel layer 52 in the formation region for the gate electrode 69 and exposing the substrate 51 in the formation region for the gate wiring 62.

Figure 14B:
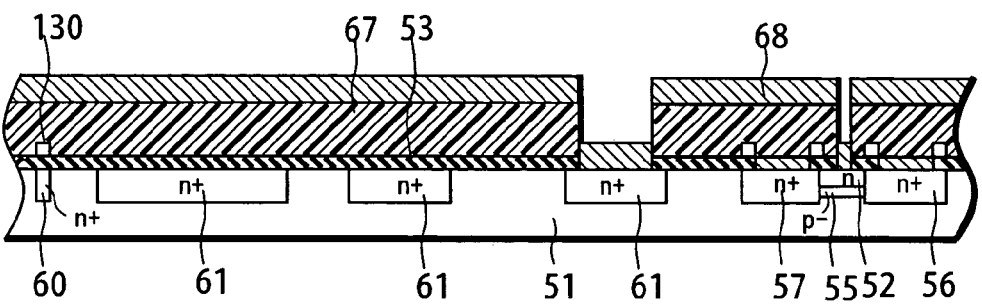

As shown in FIG. 14B, two layers of Pt/Mo collectively constituting the electrode of the second metal layer are sequentially evaporated on the substrate 51 by vacuum evaporation. Thereafter, the resist layer 67 is removed and the gate electrode 69 contacting the channel layer 52 is formed by the lift-off method. At the same time, the gate wiring 62 forming the Schottky junction with the high concentration impurity region 61 is formed.

Figure 14C:
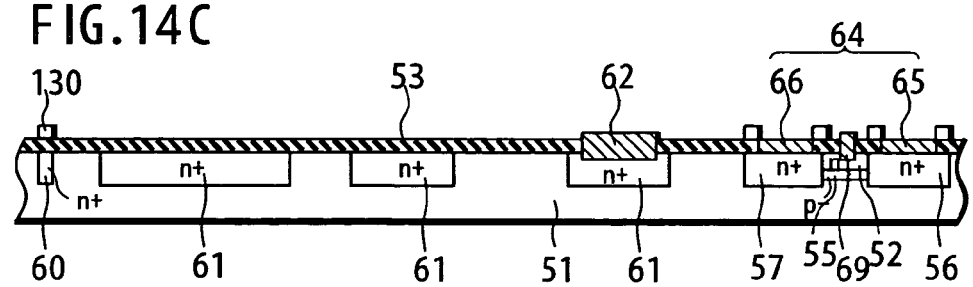

Thereafter, a heat treatment for burying Pt of the lowermost layer of the gate metal layer 68 is performed as shown in FIG. 14C. In this way, part of the gate electrode 69 is buried in the channel layer 52 while maintaining the Schottky junction with the substrate 51. The gate wiring 62 is also buried in the high concentration impurity region 61.

In this way, when adopting the buried gate electrode structure in order to enhance characteristics of the FET, the gate wiring 62 also adopts the structure to be buried into the surface of the substrate 51. Here, Pt of the gate metal layer (Pt/Mo) has very weak adhesion strength to the oxide film, and it is therefore not possible to form the gate wiring 62 on the oxide film 120. That is, it is not possible to allow the high concentration impurity region 60 to overlap the gate wiring 62 according to the manufacturing methods of the first and second embodiments, in which the oxide film 120 is left on the high concentration impurity region 60. Particularly, when another element is located adjacently on the substrate 51, the buried gate electrode structure has a problem of often causing a leak current in direct current mode with the substrate 51 as compared to a normal gate electrode structure.

In such a case, it is effective to provide the high concentration impurity region 61 so as to contact the entire surface below the gate wiring 62 and to protrude out of the gate wiring. The manufacturing method of this embodiment can realize such a structure because the oxide film 120 is not left on the high concentration impurity region 61.

Figure 15A:
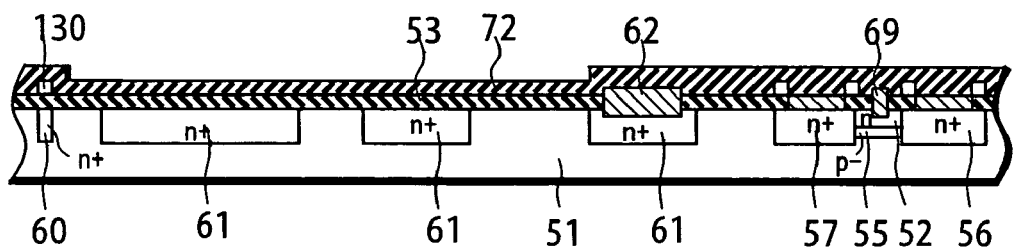
FIGS. 15A to 15C are cross-sectional views for describing the third embodiment of the present invention.

Sixth step (FIGS. 15A to 15C): After forming the gate electrode 69 and the gate wiring 62, the surface of the substrate 51 is covered with passivation film 72 made of a silicon nitride film in order to protect the channel layer 52 around the gate electrode 69 as shown in FIG. 15A.

Figure 15B:
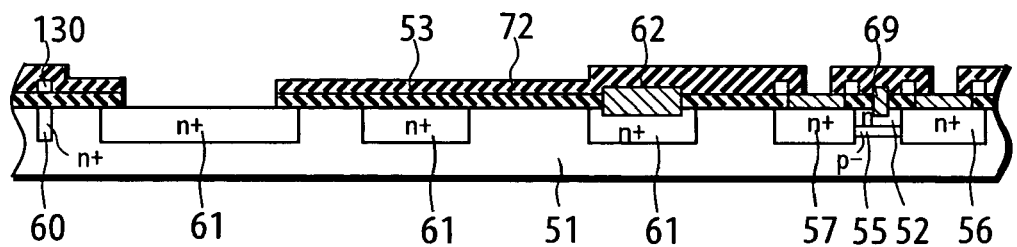

Next, as shown in FIG. 15B, a photolithography process is performed on this passivation film 72 to selectively form openings in resist (not shown) corresponding to the contact portions of the first source electrode 65 and the first drain electrode 66, and the passivation film 72 at the portions is subjected to dry etching.

Simultaneously, an opening is selectively formed in the resist corresponding to the pad electrode 77 formation region, and the passivation film 72 and the nitride film 53 at the portion are subjected to dry etching. Then, the resist layer is removed.

In this way, the contact holes are formed in the passivation film 72 above the first source electrode 65 and above the first drain electrode 66, and the surface of the substrate 51 in the pad electrode 77 formation region is exposed.

Figure 15C:
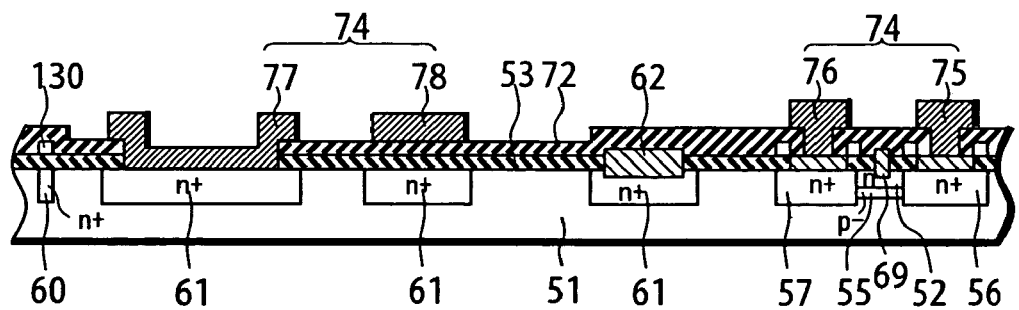

Moreover, as shown in FIG. 15C, a new resist layer (not shown) is coated on the entire surface of the substrate 51, and a photolithography process is performed to selectively form openings in the resist above respective formation regions for second source electrode 75, second drain electrode 76, the pad electrode 77, and the pad wiring 78.

Subsequently, three layers of Ti/Pt/Au collectively constituting pad metal layer 74 as the electrodes of the third metal layer are sequentially evaporated by vacuum evaporation. After removing the resist layer, the second source electrode 75 and the second drain electrode 76 contacting the first source electrode 65 and the first drain electrode 66 are formed by the lift-off method.

Simultaneously, the pad electrode 77 is formed so as to be contacted directly to the substrate 51, and then the pad wiring 78 in a given pattern is formed on the nitride film 72. The pad electrode 77 is directly contacted to the high concentration impurity region 61 provided on the entire surface therebelow, and is connected in direct current mode. Meanwhile, by disposing the high concentration impurity region 61 having the floating potential below the pad wiring 78 can prevent leakage of the high frequency signal without connection in direct current mode.

Eighth step (FIG. 1D): After completion of the above-described wafer process, the compound semiconductor switching circuit device is subjected to a assembly process for assembly. The semiconductor wafer is diced and separated into individual semiconductor chips. After bonding each semiconductor chip to a frame (not shown), the pad electrode 77 of the semiconductor chip is connected to a given lead (not shown) with bonding wire 80. A gold thin wire is used as the bonding wire 80, and connection is achieved by publicly known ball bonding. Thereafter, resin packaging is performed by transfer molding.

Figure 16:
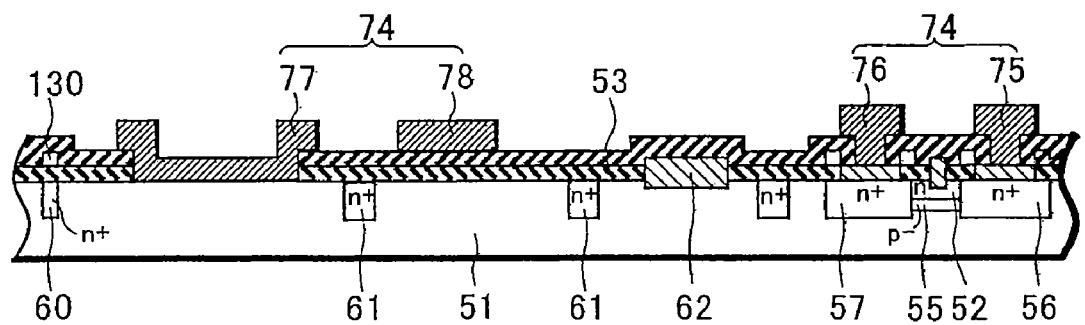
FIG. 16 is a cross-sectional view for describing the third embodiment of the present invention.
Figure 17:
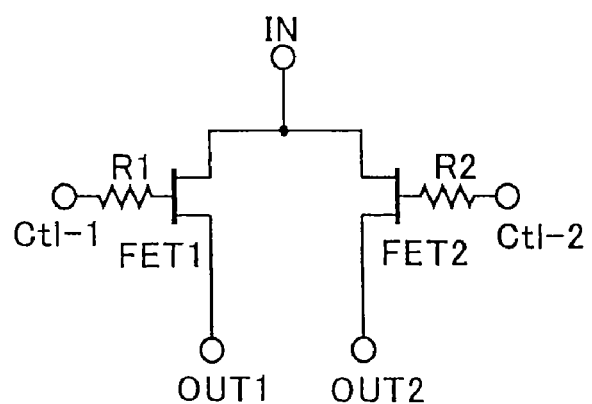
FIG. 17 is a circuit diagram showing a conventional example.
Figure 18A:
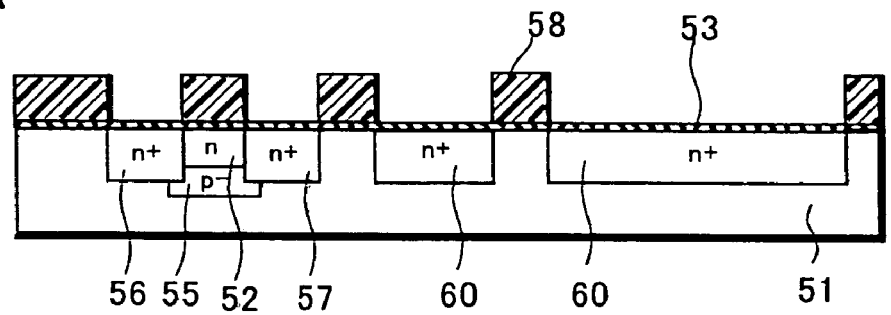
FIGS. 18A to 18C are cross-sectional views for describing the conventional example.
Figure 18B:
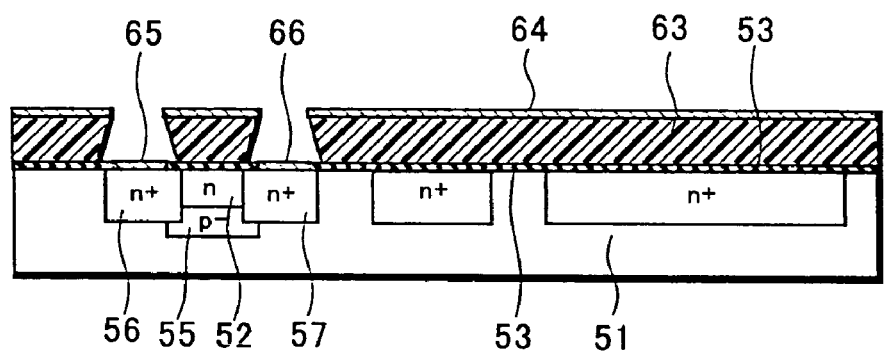
Figure 18C:
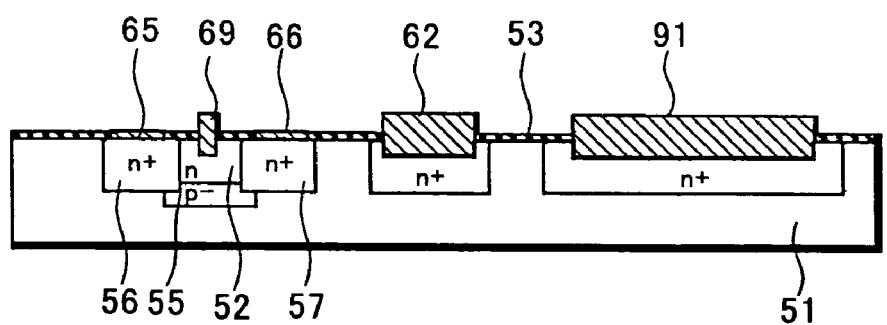
Figure 19A:
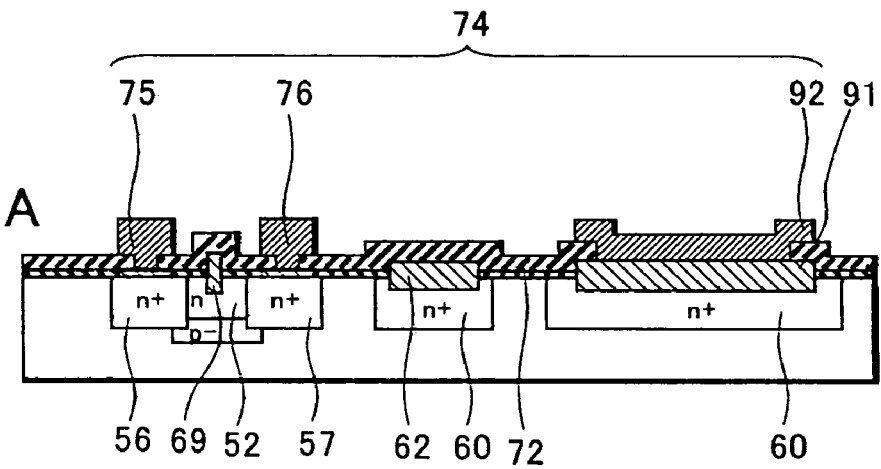
FIGS. 19A and 19B are cross-sectional views for describing the conventional example.
Figure 19B:
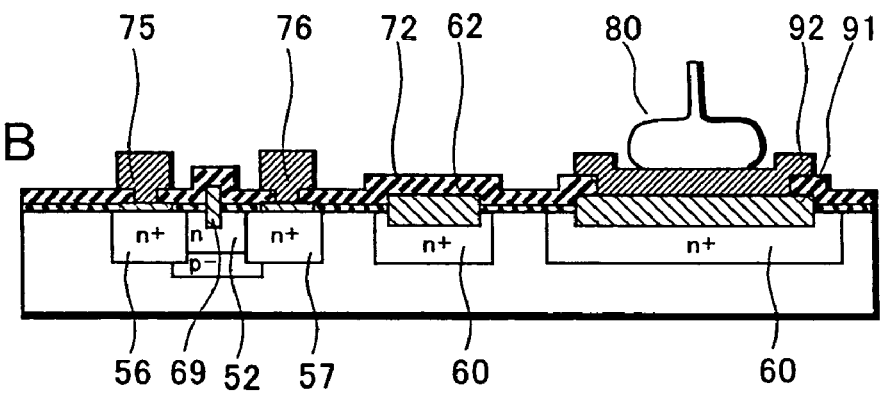

Alternatively, as shown in FIG. 16, it is possible to change a resist pattern upon formation of the high concentration impurity region 61 in the third step, and to form the high concentration impurity region 61 around but away from the pad electrode 77. For example, when there is only a limited space on a chip, the high concentration impurity region 61 may be disposed on the substrate 51 between the pad electrode 77 and either the pad wiring 78 or the gate wiring 62 adjacent thereto.

Moreover, throughout the first to third embodiments, the patterns of the high concentration impurity regions 60 and 61 connected to the pad electrode 77 in direct current mode, and the patterns of the high concentration impurity regions 60 and 61 provided for preventing leakage of the high frequency signal from the gate wiring 62 and the pad wiring 78 can be appropriately combined depending on integration patterns.

The following effects are obtained by the embodiments of the present invention.

In the first place, the pad electrode is formed solely by use of the pad metal layer instead of disposing the gate metal layer at the pad electrode portion. Therefore, in the case of a buried gate electrode structure, it is possible to prevent defects at the time of wire bonding of the pad electrode. Conventionally, the gate metal layer has been provided below the pad electrode. For this reason, part of the gate metal layer below the pad electrode has been buried and hardened, thereby leading to numerous defects at the time of wire bonding. However, according to the embodiment of the present invention, it is possible to avoid such defects and to enhance yields and characteristics.

In the second place, since the high concentration impurity region is provided below the pad electrode so as to protrude out of the pad electrode, it is possible to suppress a depletion layer which extends from the pad electrode toward the substrate. That is, it is possible to ensure sufficient isolation even in the case of the structure without the nitride film as similar to the conventional technique.

In the third place, the high concentration impurity region may be separated from the pad electrode and provided on the substrate around the pad electrode. Accordingly, even in the structure configured to contact the pad electrode solely made of the pad metal layer directly to the substrate, it is possible to ensure isolation by small spaces between the respective formation elements.

In the fourth place, according to the manufacturing method of the embodiment of the present invention, it is possible to realize the pad electrode solely made of the pad metal layer without disposing the gate metal layer. Since the gate metal layer which is apt to be hardened by burying is not disposed, it is possible to suppress defects such as bonding defects at the time of bonding or gouges on the substrate. That is, it is possible to provide the method of manufacturing a compound semiconductor device capable of enhancing reliability and yields.

In the fifth place, it is possible to form the FET having the buried gate electrode without disposing the gate metal layer, which is hardened by being buried below the pad electrode. Therefore, it is possible to provide the method of manufacturing a compound semiconductor device capable of enhancing characteristics of the FET and furthermore suppressing defects at the time of bonding.

In the sixth place, since the high concentration impurity region is formed on the substrate below the pad electrode, it is possible to provide the method of manufacturing a compound semiconductor device capable of suppressing a depletion layer which extends from the pad electrode and enhancing isolation.

In the seventh place, the high concentration impurity region may be separated from the pad electrode and provided on the surface of the substrate around the pad electrode. Accordingly, even in the structure configured to contact the pad electrode solely made of the pad metal layer directly to the substrate, it is possible to realize the method of manufacturing a compound semiconductor device capable of ensuring isolation by small spaces between the respective formation elements.

In the eighth place, the channel layer, the source region, and the drain region of the FET can be formed by implanting ions on the compound semiconductor substrate. Accordingly, it is possible to form the FET at lower costs than a method of forming the channel layer by growing epitaxial layers. Moreover, the embodiment of the present invention only requires modification of a mask pattern used in a photoresist process for the gate metal layer. In this way, it is possible to realize a buried gate electrode structure having fine FET characteristics while avoiding defects at the time of wire bonding. Therefore, it is possible to enhance reliability and to improve yields without increasing the number of steps.

In the ninth place, the insulating film is formed on the source region and the drain region in the step of forming the source region and the drain region. In this way, it is possible to perform mask alignment of the first source electrode, the first drain electrode, and the gate electrode directly with the source region and the drain region, and thereby to form a FET having small channel resistance.

What is claimed is:

1. A compound semiconductor device comprising:
   a compound semiconductor substrate;
   a channel layer formed in the substrate;
   a source region and a drain region that are formed in the substrate and adjacent the channel layer;
   a gate electrode made of a gate metal layer and in contact with the channel layer;
   a source electrode comprising a first source electrode made of an ohmic metal layer and in contact with the source region and a second source electrode made of a pad metal layer and disposed on the first source electrode;
   a drain electrode comprising a first drain electrode made of the ohmic metal layer and in contact with the drain region and a second drain electrode made of the pad metal layer and disposed on the first drain electrode;
   a pad electrode made of the pad metal layer and in direct physical contact with the substrate, the pad metal layer comprising a metal not included in the gate metal layer; and
   a high concentration impurity region formed in the substrate and adjacent the pad electrode.

2. The compound semiconductor device of claim 1, wherein the gate electrode is partially buried in the substrate.

3. The compound semiconductor device of claim 1, wherein the pad electrode is in contact with the high concentration impurity region, and part of the high concentration impurity region is not covered by the pad electrode.

4. The compound semiconductor device of claim 1, wherein the pad electrode is separated from the high concentration impurity region so that a separation between the pad electrode and the high concentration impurity region is such that a current flow is maintained under an application of direct current.

5. The compound semiconductor device of claim 1, further comprising an insulating film that is disposed on the source region for an alignment of the source region or disposed on the drain region for an alignment of the drain region.

6. The compound semiconductor device of claim 1, wherein the high concentration impurity region is configured to suppress an expansion of a depletion layer extending from the pad electrode.

7. The compound semiconductor device of claim 1, wherein the pad electrode is configured to transmit an analog signal in a gigahertz range.

8. The compound semiconductor device of claim 1, wherein an impurity concentration of the high concentration impurity region is $1 \times 10^{17}$ cm$^{-3}$ or higher.

9. The compound semiconductor device of claim 1, wherein the pad electrode is disposed on the high concentration impurity region so that the pad electrode is confined within a lateral boundary of the high concentration impurity region.

* * * * *